United States Patent
Stein et al.

(10) Patent No.: US 7,165,211 B2
(45) Date of Patent: Jan. 16, 2007

(54) VITERBI DECODER WITH DIRECT CURRENT RESTORATION

(75) Inventors: Anatoli B. Stein, Atherton, CA (US); Semen P. Volfbeyn, Milpitas, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 290 days.

(21) Appl. No.: 10/945,117

(22) Filed: Sep. 20, 2004

(65) Prior Publication Data
US 2006/0064628 A1    Mar. 23, 2006

(51) Int. Cl.
*H03M 13/03*    (2006.01)
(52) U.S. Cl. ....................................................... 714/795
(58) Field of Classification Search ................. 714/795
See application file for complete search history.

(56) References Cited

U.S. PATENT DOCUMENTS

| | | | |
|---|---|---|---|
| 6,249,553 B1 * | 6/2001 | Honma ........................ | 375/341 |
| 6,404,829 B1 * | 6/2002 | Sonu ............................ | 375/345 |
| 6,707,624 B1 * | 3/2004 | Erden et al. ................... | 360/31 |
| 2003/0002419 A1 * | 1/2003 | Kuma et al. .............. | 369/59.22 |
| 2003/0043487 A1 * | 3/2003 | Morita et al. .................. | 360/25 |

* cited by examiner

*Primary Examiner*—Shelly Chase
(74) *Attorney, Agent, or Firm*—Mark G. Lappin; Foley & Lardner LLP

(57) ABSTRACT

A decoder for detecting data within an input signal with attenuated low frequency components that comprises a Viterbi decoder, is disclosed. Viterbi decoder internal data is used along with its output bits to reduce delay between the restored direct current (DC) component and the input signal to zero. As a result, increased accuracy of DC restoration and corresponding bit error rate reduction are achieved.

13 Claims, 10 Drawing Sheets

○ -- prior art
+ -- present invention

VITERBI DECODER WITH DIRECT CURRENT RESTORATION

FIELD OF THE INVENTION

The present invention relates generally to the detection of data in channels where the signal low frequency components are suppressed or lost completely. The present invention more particularly relates to read-back signal processing in data storage systems, based on magnetic perpendicular recording and partial response maximum likelihood (PRML) detection.

BACKGROUND OF THE INVENTION

There is a constant demand for increasing data storage capacity in digital systems. This results in continuous development of different ways to increase the density of magnetic recording. One of the recently developed, promising architectures of data storage systems, based on magnetic recording, is perpendicular recording, which is believed to have more high density potential compared to existing longitudinal recording. In longitudinal recording the magnetic medium on a disk is magnetized in a direction parallel to the surface of the disk, whereas in perpendicular recording, the media is magnetized in a direction perpendicular to the surface of the disk.

The nature of perpendicular recording brings its own difficulties. One difficulty is due to the fact that in longitudinal recording read-back signal has no DC component, while a significant part of perpendicular read-back signal power is located in low frequency region, a detrimental effect. In conventional read channel preamplifiers, capacitance coupling is used along the signal path, resulting in loss of any read-back signal DC component.

Another difficulty with perpendicular recording is linked to interference noise from neighboring tracks. For adjacent track-induced interference, suppression is usually effected by a high pass filter (HPF) with a steep loss at low frequencies. However, such a high pass filter eliminates not only the noise from adjacent tracks, but significant low frequency components of the read-back signal as well. As a consequence of the latter, a considerable amount of information in the written data is lost. The loss of the DC component also causes baseline "wander" in a read-back signal and makes initial data recovery difficult or impossible.

A block-diagram of a conventional PRML receiver for read-back signal processing is shown in FIG. 1. The receiver consists of read channel preamplifiers 100, analog low pass filter (LPF) 101, analog to digital converter (ADC) 102, high pass filter (HPF) 103, equalizer 104, clock recovery 105 and Viterbi decoder 106. The main function of HPF 103 is to mask the effects of sources of DC component loss and suppress low frequency noise, particularly, the noise that is caused by interference from adjacent tracks.

A block-diagram of a prior art Viterbi decoder is shown in FIG. 2. The Viterbi decoder of FIG. 2 constitutes a state machine, that comprises, in general case, N states. The Viterbi decoder includes a set of 2N metric calculators 200-0 . . . 200-(2N−1). In each metric calculator an expected ideal sample for the associated state and the hypothetical next bit is specified. At each sample interval, a metric calculator computes an Euclidean error metric as squared difference between the actual signal sample at Viterbi decoder input and an expected ideal sample. The computed metric is transferred from metric calculator to an associated one of the add-compare-select (ACS) circuits 201-0 . . . 201-(N−1). The ACS circuit adds the new computed metric to the previously accumulated branch metric for each of the two branches entering the corresponding state in the state transition diagram. Then, the two accumulated branch metrics compared, and the smaller is selected as the surviving branch metric for that state. For each state the Viterbi decoder finds a string of bits that provides the best approximation to the input signal on condition that this state survives. These strings of bits form candidates for future bits at the output of the Viterbi decoder and are kept in the candidate registers 203-0 . . . 203-(N−1). Each candidate register has a bidirectional exchange inout, that enables reading of the current contents of the candidate register and/or writing new contents into it. All bidirectional exchange inouts of the candidate registers 203-0 . . . 203-(N−1) are united. providing for a possible transfer of stored bits from one candidate register to another. Outputs of ACS circuits 201-0 . . . 201-(N−1) are connected to the inputs of candidate registers controller 202. In response to applied branch select control signals, the candidate registers controller 202 shifts into each of the candidate registers 203-0 . . . 203-(N−1) the appropriate binary symbol corresponding to the branch selected. Further, the candidate registers controller 202 merges the survivor candidate sequences, stored in candidate registers 203-0 . . . 203-(N−1) based on branches that were eliminated. Eventually all candidates merge into one survivor sequence, so that all candidates registers contain the same bits near their outputs. The Viterbi decoder output can be taken from the last cell of any one of the candidate registers; in FIG. 2 the output is taken from the last candidate register.

There are several different prior art methods of data detection in the presence of DC component loss. One of them, that is used more often than others, is disclosed in US Patent Application Serial No. 2003/0107831. According to this method, a feedback loop is added to the Viterbi decoder, as shown in FIG. 3. The feedback loop comprises two low pass filters: LPF1 302 and LPF2 303. Filter LPF1 302 complements the readback channel in the sense, that if the same digital signal is applied to the inputs of LPF1 and read channel, then LPF1 output waveform coincides or is close to the suppressed low frequency part of read channel output. In the same sense filter LPF2 303 complements the HPF 103, that constitutes a part of PRML receiver, shown in FIG. 1. Detected digital signal from the Viterbi decoder 106 output is applied to the input of the filter LPF1 302, and the output of LPF1 302 is connected to the input of the filter LPF2 303. The signal at the output of the filter LPF2 303 represents DC component (or, what is the same, low frequency part) of the Viterbi decoder output and is supposed to be close to DC component of the original digital signal, that was written to the disk. This signal is added in the adder 300 to the signal, coming to the Viterbi decoder input. Thus, the DC component restoration and corresponding improvement of the overall system performance are ensured.

This method of DC component restoration, while being somewhat effective, has however a serious drawback. The output signal of the Viterbi decoder of FIG. 2 is delayed in relation to the input signal for m bits, the delay m being equal to combined length of a candidate register 203-i and a state. Typically in the prior art, m lies in the range 10–20 bits. If length of a bit cell is T seconds, then time delay that occurs in the Viterbi decoder, equals mT seconds. The DC component of the Viterbi decoder output signal is delayed in relation to the input signal for the same interval of mT seconds. As a consequence, DC component restoration occurs with some distortions. As a result, a source of additional errors appears that is especially noticeable when bit error rate is low.

An algorithm, that provides for DC component restoration in data storage system, based on magnetic perpendicular recording, without unwanted delay between restored DC component and original read-back signal and that, therefore, avoids occurrence of additional errors, would be a significant improvement in the art.

SUMMARY OF THE INVENTION

It is an object of the present invention to provide an improved Viterbi decoder with DC component restoration based on a configuration that eliminates the delay in the restored DC component and, therefore, avoids occurrence of additional errors.

More particularly, the present invention improves the accuracy of DC component restoration by the use of the internal structure of the Viterbi decoder. For any state, bits that will appear at the Viterbi decoder output in the nearest future, if the decoder branch that corresponds to this state survives, are known. These bits are contained in the corresponding candidate register of the Viterbi decoder and in the state itself. The prediction of the future Viterbi decoder output bits are used to perform DC component restoration without delay in relation to the input signal, thus eliminating the source of bit error rate additional degradation.

The use of the Viterbi decoder with the DC component restoration according to the present invention provides for the performance improvement of data storage systems based on magnetic perpendicular recording. The main achievement is the reduction of the error rate in the data that are written to and read from the data storage system.

The cited above object of the present invention is accomplished by an incorporation of a correction unit between the input terminal and the metric calculators of the Viterbi decoder. Further still a feedback bus is included, this feedback bus transferring the strings of bits that are stored in the candidate registers of the Viterbi decoder to the correction unit. The correction unit uses the string of bits from each candidate register for restoring the DC component in the partial input signal that is send to the input of the associated metric calculator. The DC component restoration in the different partial input signals is effected independently.

In another aspect of the present invention, in order to accomplish its object the correction unit includes a padding high pass filter, a set of DC calculators and a set of adding circuits. The padding high pass filter generates a DC component that corresponds to the sequence of detected bits from the Viterbi decoder output, these detected bits being padded by m zeros where m is Viterbi decoder delay in bits. Each of the DC calculators generates a DC component that corresponds to the string of bits stored in the associated candidate register of the Viterbi decoder and combines it with the DC component from the padding high pass filter. In that way at the output of the DC calculator a correction signal is produced. Each adding circuit adds the correction signal from the associated DC calculator to the original read-back signal and by doing so creates the partial input signal that is send to the associated metric calculator of the Viterbi decoder.

In order to accomplish the object cited above, in yet another aspect of the present invention the padding high pass filter includes an equivalent high pass filter, a coefficients memory and a predictor. The equivalent high pass filter reproduces the expected write/read channel response to the sequence of Viterbi decoder output bits. This filter translates to its output the input samples In[i−m−j], 0<=j<=n, as well as the last n of its output samples Out[i−m−j], 0<=j<=n. Here i is the number of the current sampling interval, m is the delay of the Viterbi decoder in bits and n is the order of the equivalent high pass filter. The predictor generates the DC component that corresponds to the sequence of detected bits padded by zeros with the use of the coefficients received from the coefficients memory. If the coefficients that are kept in the coefficients memory are designated as A[j] and B[j], then the sample Out at the output of the predictor is calculated according to the rule:

$$\mathrm{Out} = \sum_{j=0}^{n} B[j] * \mathrm{In}[i-m-j] + \sum_{j=0}^{n} A[j] * \mathrm{Out}[i-m-j].$$

In order to accomplish the object cited above, in yet another aspect of the present invention the DC calculator includes a state number register, a concatenation unit, a responses table memory, an adder and a subtracter. The state number register is used for storing the state number associated with this DC calculator. The concatenation unit combines the state number with the string of bits that comes from the candidate register of the Viterbi decoder into an aggregate binary combination. The responses table memory generates response sample using as an address the binary combination received from the concatenation unit. The adder produces the sum of the response created by the responses table memory and the response that is generated by the padding high pass filter. This sum is subtracted in the subtracter from the last bit of the state number, producing in that way the last sample of the restored DC component for the associated state.

In yet another aspect of the present invention, in order to create an improved PRML receiver for reproduction of the user data in a storage device based on perpendicular magnetic recording with a reduced error rate, the disclosed Viterbi decoder with DC component restoration is complemented to a chain of units connected in cascade, this chain including read preamplifiers, a low pass filter, an analog to digital converter, a high pass filter, and an equalizer. The input of the Viterbi decoder with DC component restoration is connected to the output of the equalizer. The output of the Viterbi decoder with DC component restoration is used as the output of the PRML receiver.

DETAILED DESCRIPTION OF THE PREFERRED EMBODIMENTS

Figure 3:
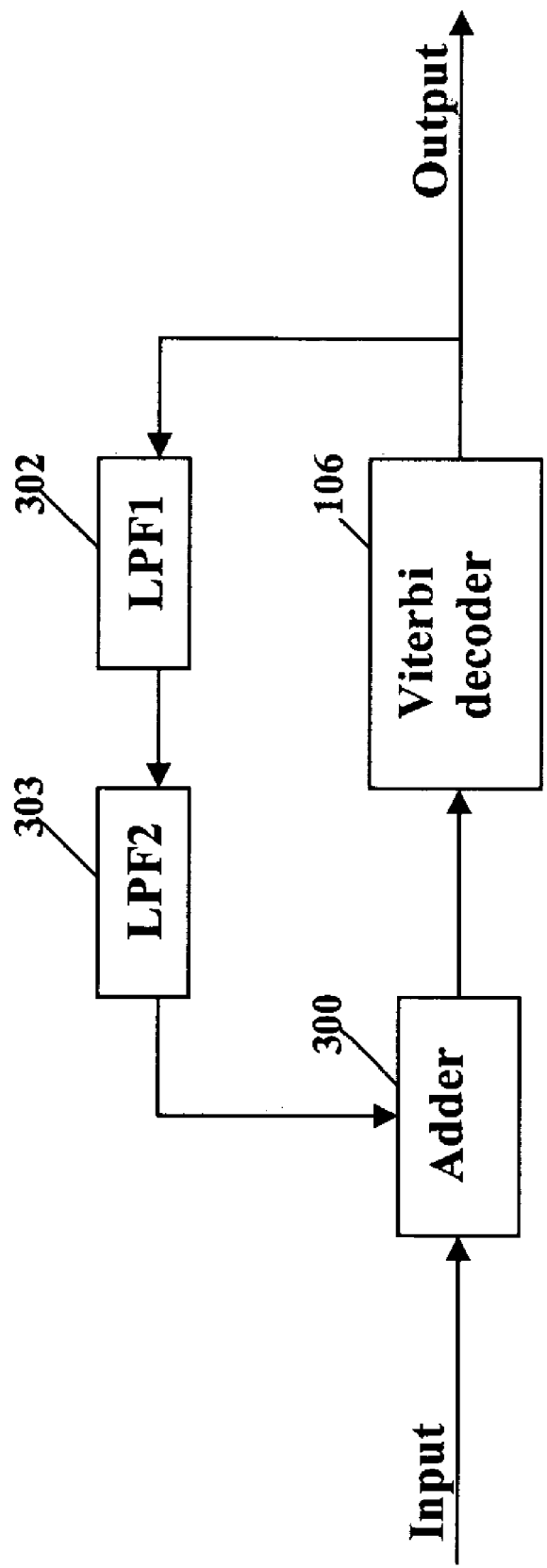
FIG. 3 is a block diagram of Viterbi decoder with DC component restoration in accordance with the prior art.
Figure 4A:
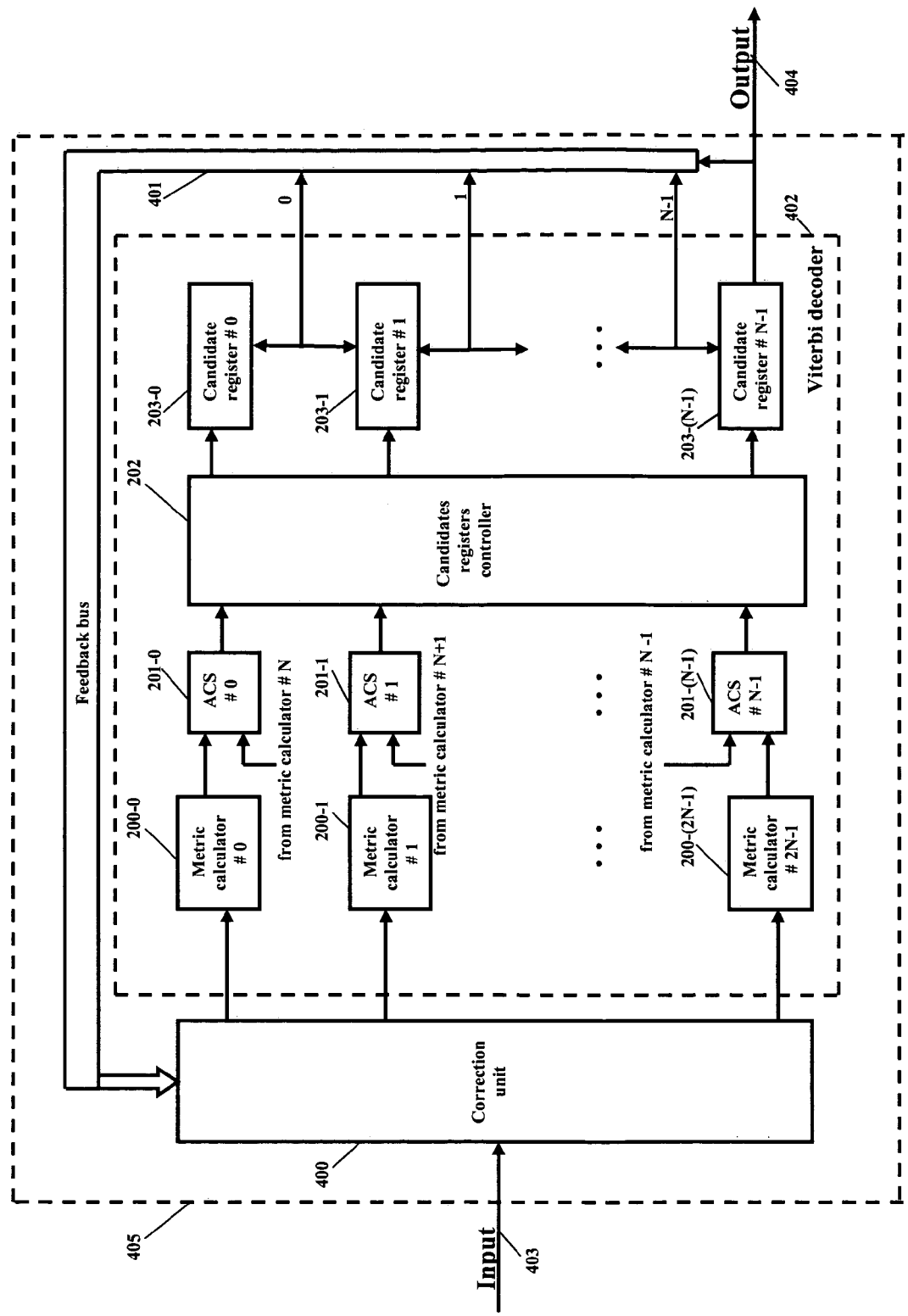
FIG. 4a is a block diagram of a first embodiment of a Viterbi decoder with DC component restoration according to the present invention.

The 2N inputs of the metric calculators may be considered as partial inputs of the Viterbi decoder. In the block diagram of FIG. 2 they are united and connected to the input terminal of the decoder. The N bidirectional exchange inouts of the candidate registers may be considered as partial terminations of the decoder. According to the present invention DC component restoration is achieved by adding to a conventional-type Viterbi decoder not a single feedback circuit (as illustrated in the FIG. 3), but a set of feedback loops, one loop for each state. In every loop, a restored DC component is calculated in assumption that corresponding state will survive. The most recent sample of the restored DC component, is added to the respective current sample of the input signal and the resulting sum is placed at the corresponding partial input of the Viterbi decoder. An exemplary Viterbi decoder with DC component restoration 405 according to the present invention is shown in FIG. 4a. In this diagram, the elements corresponding to the elements of FIG. 2 are identified by the same reference designations.

Figure 1:
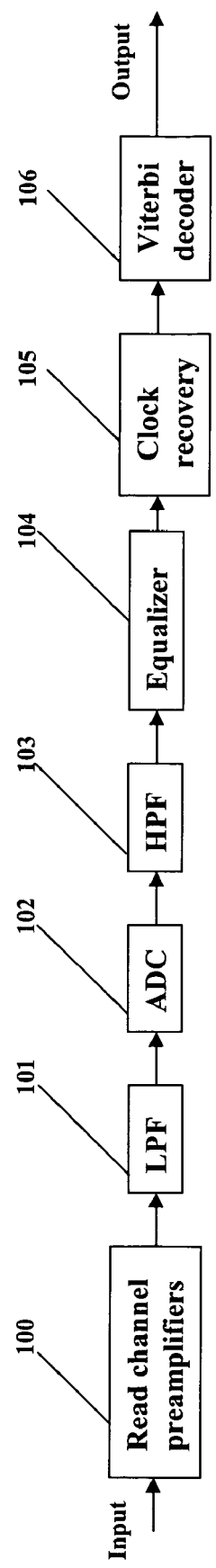
FIG. 1 is a block diagram of a prior art PRML receiver.
Figure 4B:
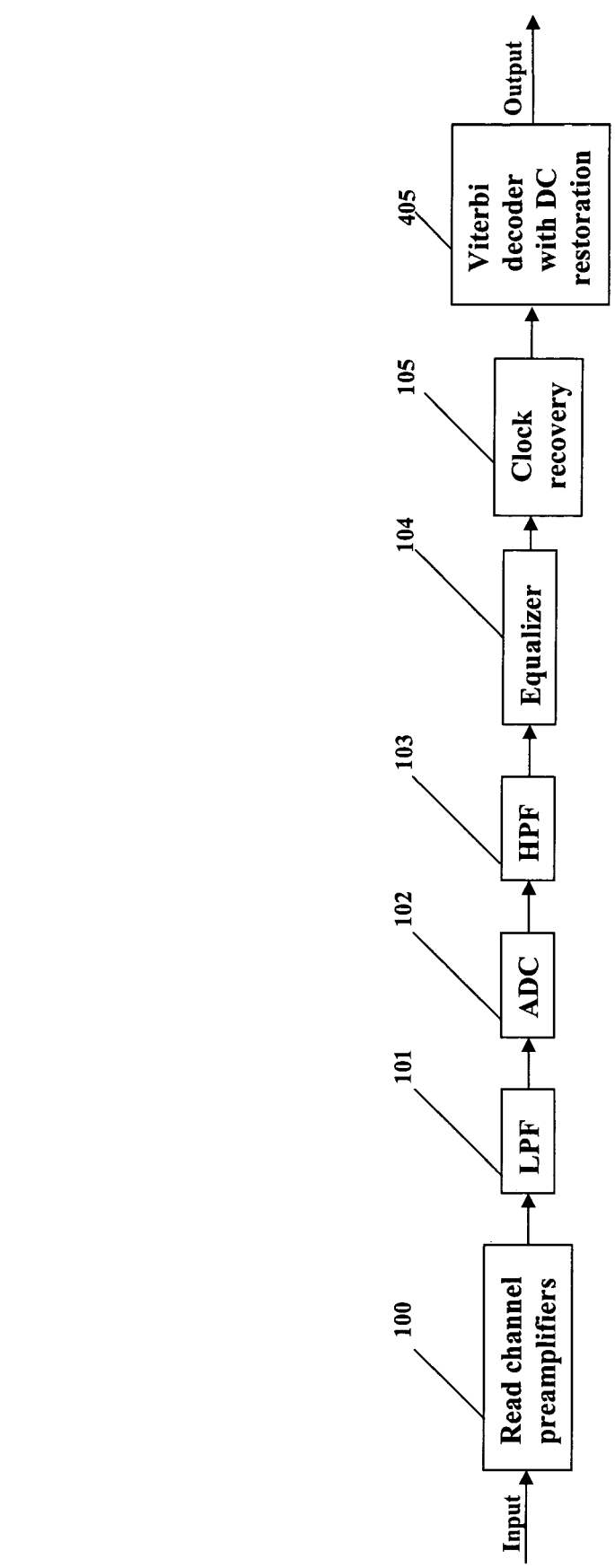
FIG. 4b is a block diagram of an exemplary PRML receiver in accordance with the present invention.

The decoder 405 may be used in place of the Viterbi decoder 106 in FIG. 1 to provide an improved PRML receiver as shown in FIG. 4b.

Figure 2:
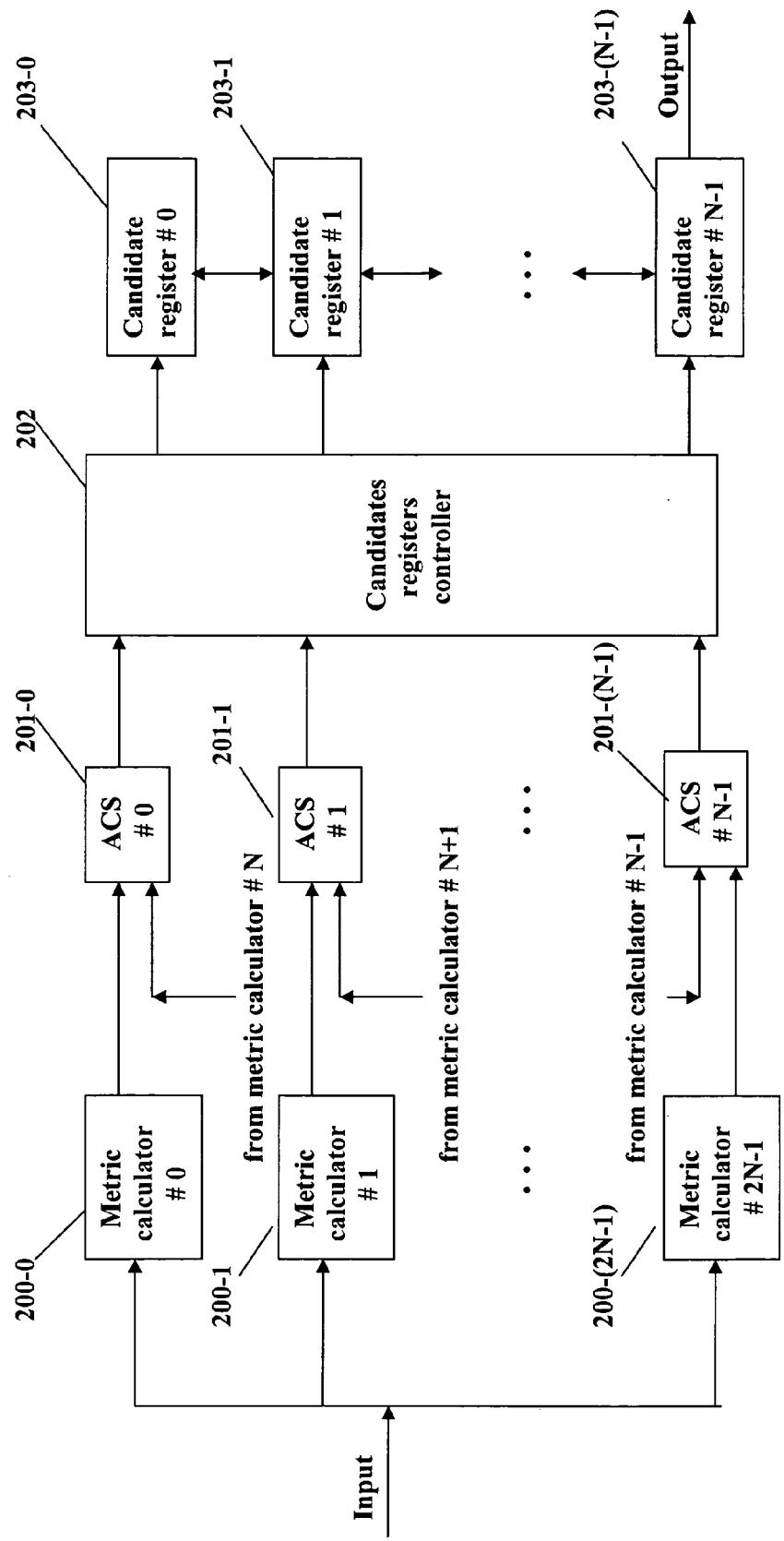
FIG. 2 is a block diagram of a prior art Viterbi decoder.

In the illustrated embodiment, the decoder 405 includes a Viterbi decoder 402 (which is the same as the Viterbi decoder shown in FIG. 2), an input terminal 403 (which corresponds to the "Input" in FIG. 2) and an output 404 (which corresponds to the "Output" in FIG. 2). A correction unit 400 is inserted between the input terminal 403 and the partial inputs of the Viterbi decoder 402 (that are the same as the inputs of the metric calculators 200-0 . . . 200-(2N−1)). A feedback bus 401 connects the partial terminations of the Viterbi decoder 402 (that coincide with the bidirectional exchange inouts of the candidate registers 203-0 . . . 203-(N−1)) to the correction unit 400. The correction unit 400 receives through the feedback bus 401 the next decoded bit from the output 404 of the Viterbi decoder 402 together with the strings of bits that are stored in the candidate registers 203-0 . . . 203-(N−1). The operation of the correction unit 400 results in creation of the N partial DC components, one component for each state. Each partial DC component is added to the input read-back signal, generating in that way partial input signals that are directed to the inputs of the metric calculators 200-0 . . . 200-(2N−1). The use of the strings of bits that are stored in the candidate registers 203-0 . . . 203-(N−1) and have not yet come out to the output 404 of the Viterbi decoder 402, ensures zero delay of the N partial DC components in respect to the input read-back signal.

Figure 6:
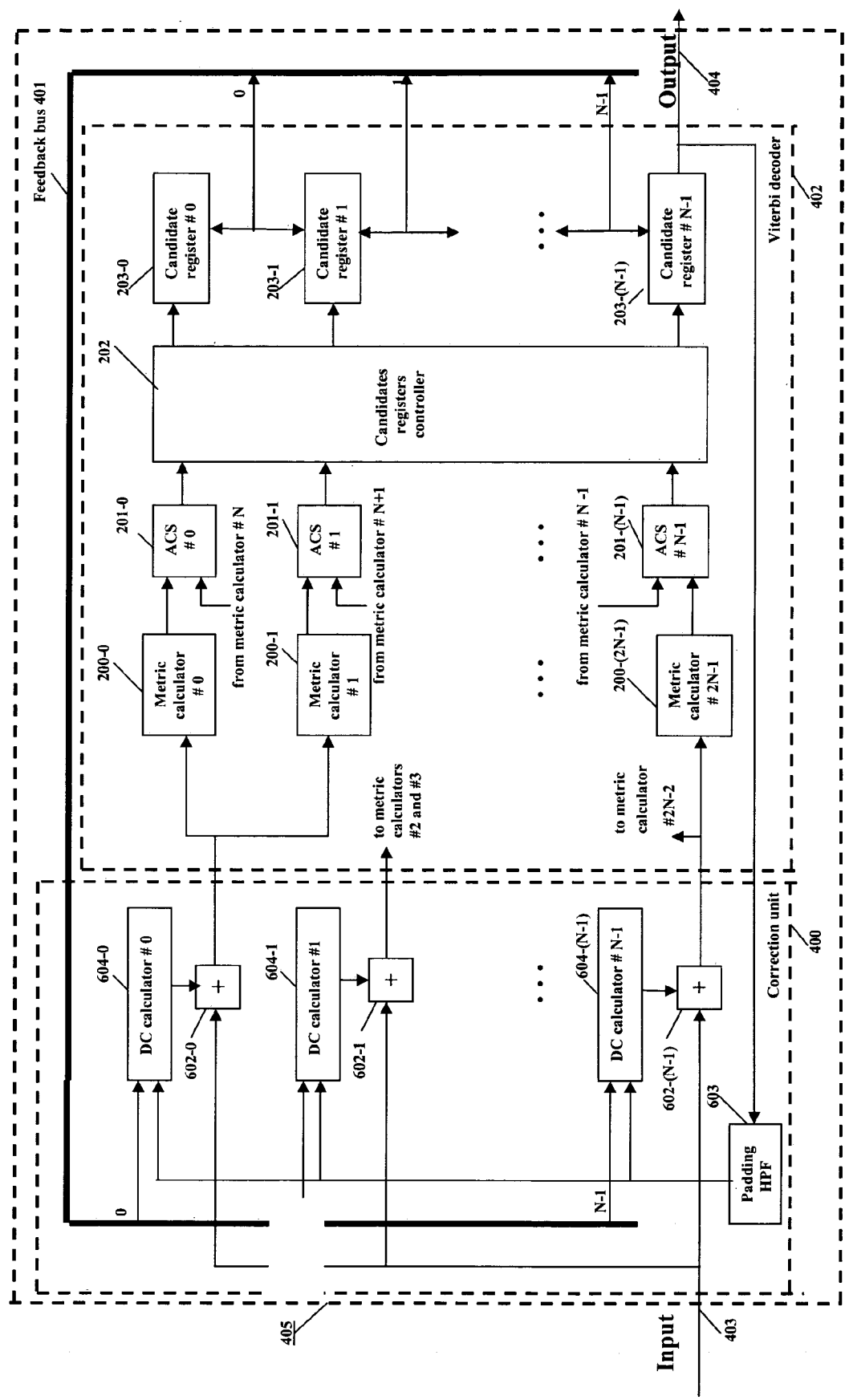
FIG. 6 is a block diagram of a second embodiment of a Viterbi decoder with DC component restoration according to the present invention.

FIG. 6 shows a block diagram of a second exemplary Viterbi decoder with DC component restoration 405 of the present invention. In this diagram, the elements corresponding to the elements of FIG. 2 and FIG. 4 are identified by the same reference designations. The correction unit 400 comprises here the padding HPF 603, the DC calculators 604-0 . . . 604-(N−1) and the adding circuits 602-0 . . . 602-(N−1). The decoder 405 may be used in place of the Viterbi decoder 105 in FIG. 1, to provide an improved PRML receiver, as shown in FIG. 4b.

Figure 5:
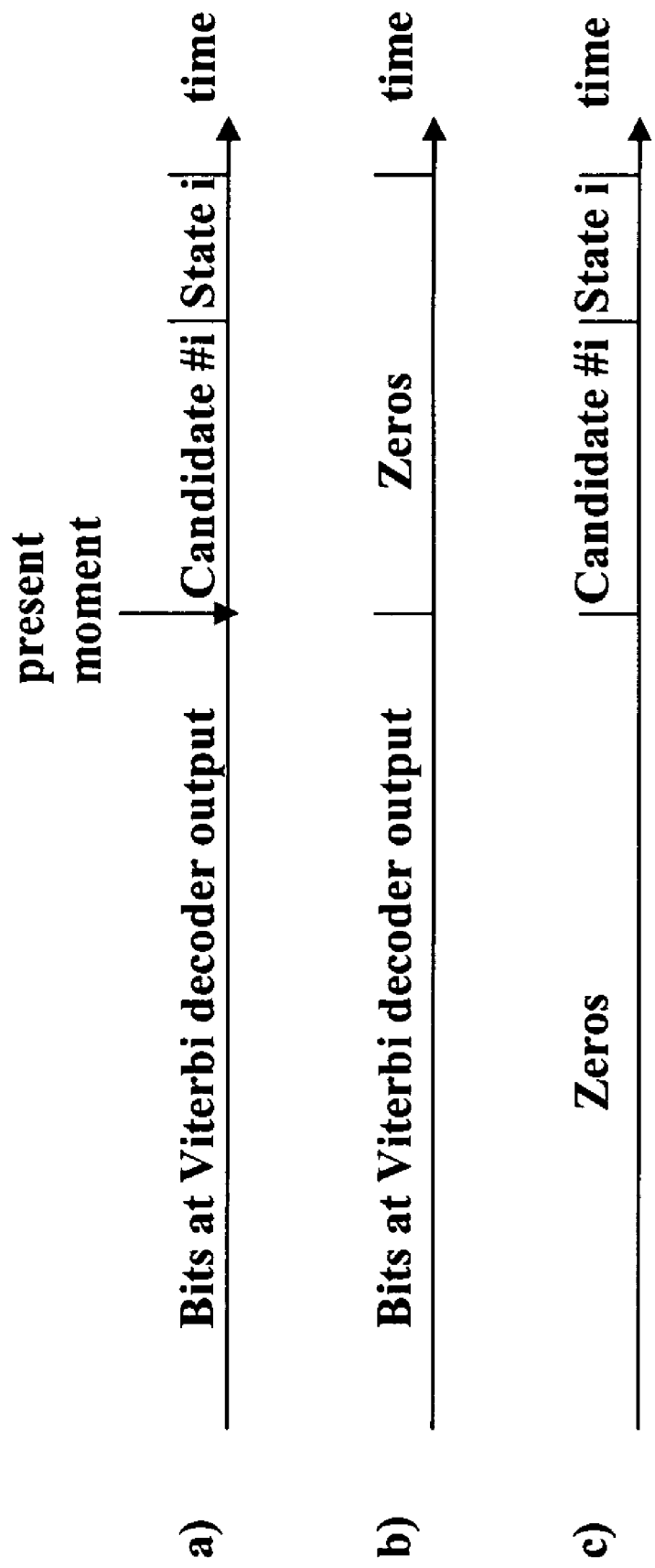
FIG. 5 shows how a digital signal, that consists of former Viterbi decoder output bits and future (predicted) bits, may be expanded in a sum of two signals.

The Viterbi decoder with DC component restoration that is shown in FIG. 6 makes rigorous use of the intrinsic structure of the processed digital signals. FIG. 5a shows a digital signal that consists of the former Viterbi decoder output bits appended by the candidate #i and state i (candidate #i being the conventional name for the string of bits that is stored in the candidate register 203-i). This digital signal may be expanded into a sum of two addends: (1) sequence of bits, that actually have appeared at Viterbi decoder output, padded with zeros (FIG. 5b) and (2) sequence of zeros concatenated with the candidate i and a state i (FIG. 5c). With this configuration, the DC component of the signal, shown in FIG. 5a, is the sum of the DC component of the signal, shown in FIG. 5b, and the DC component of the signal, shown in FIG. 5c.

In the block diagram of FIG. 6 the output bits of the Viterbi decoder are transferred one by one to the input of a padding HPF 603. Here, at every sample interval, the DC component of former Viterbi decoder output bits padded with zeros (see FIG. 5b), is calculated. Since the signal shown in FIG. 5b is the same for all Viterbi decoder states, only one padding HPF 403 is needed. The output of the padding HPF 403 is joint with second inputs of all DC calculators 604-0 . . . 604-(N−1). Each of DC calculators 604-i, $0 \subseteq i \subseteq N-1$, receives at its first input the corresponding candidate from the candidate register 203-i through the feedback bus 401. Each of DC calculators generates a partial correction signal by calculating the DC component of the received candidate (see FIG. 5c) and by adding it to the DC component of the padded sequence of bits from the padding HPF 403. The calculated partial correction signal passes from the output of the DC calculator to the first input of the corresponding adding circuit 602-i. The second input of each adding circuit is connected to the decoder input 403. At the output of the adding circuit 602-i a partial input signal for Viterbi decoder 402 is created. This signal comes to the inputs of corresponding metric calculators. Hereinafter, the Viterbi decoder processes the signals that have come to the inputs of the metric calculators in a conventional manner. Since contents of a candidate register are changed every sample interval, the described calculations are perfectly repeated every sample interval.

In a preferred form of the invention, realization of the padding HPF 403 and the DC calculators 604-0 . . . 604-(N−1) is based on using the responses of an equivalent HPF to signals, shown in FIG. 5b and FIG. 5c accordingly. The equivalent HPF is a filter that has the same transfer function as a cascade connection of two units: (1) a high pass filter, simulating read channel suppression of low frequency components, and (2) high pass filter 103 (FIG. 1), used in PRML receiver to eliminate low frequency noise. A direct evaluation of the mentioned responses requires computing the result of a transmission of new and long enough signals through the equivalent HPF at each sample interval. The computational load to perform the necessary calculations is relatively large, but can be done with a sufficient components platform. An alternate, and less demanding method for development of the padding HPF and the DC calculators is preferably employed.

With that method, an output sample Out[i] in IIR high pass filter of the order n depends on n+1 input samples In[i], In[i−1], . . . , In[i−n] as well as on n previous output samples Out[i−1], Out[i−2], . . . , Out[i−n]:

$$\text{Out}[i] = \sum_{j=0}^{n} b[j] * \text{In}[i-j] + \sum_{j=1}^{n} a[j] * \text{Out}[i-j]. \quad (1)$$

Here, a[] and b[] are filter coefficients that define its internal structure. For a specific kind of input signal with m last samples that equal zero (as in FIG. 6b), output sample Out[i] may be determined in a different but a similar way:

$$\text{Out}[i] = \sum_{j=0}^{n} B[j] * \text{In}[i-m-j] + \sum_{j=1}^{n} A[j] * \text{Out}[i-m-j]. \quad (2)$$

New coefficients A[] and B[] for a given filter are determined from the standard coefficients a[] and b[] by an algebraic transformations.

Figure 7:
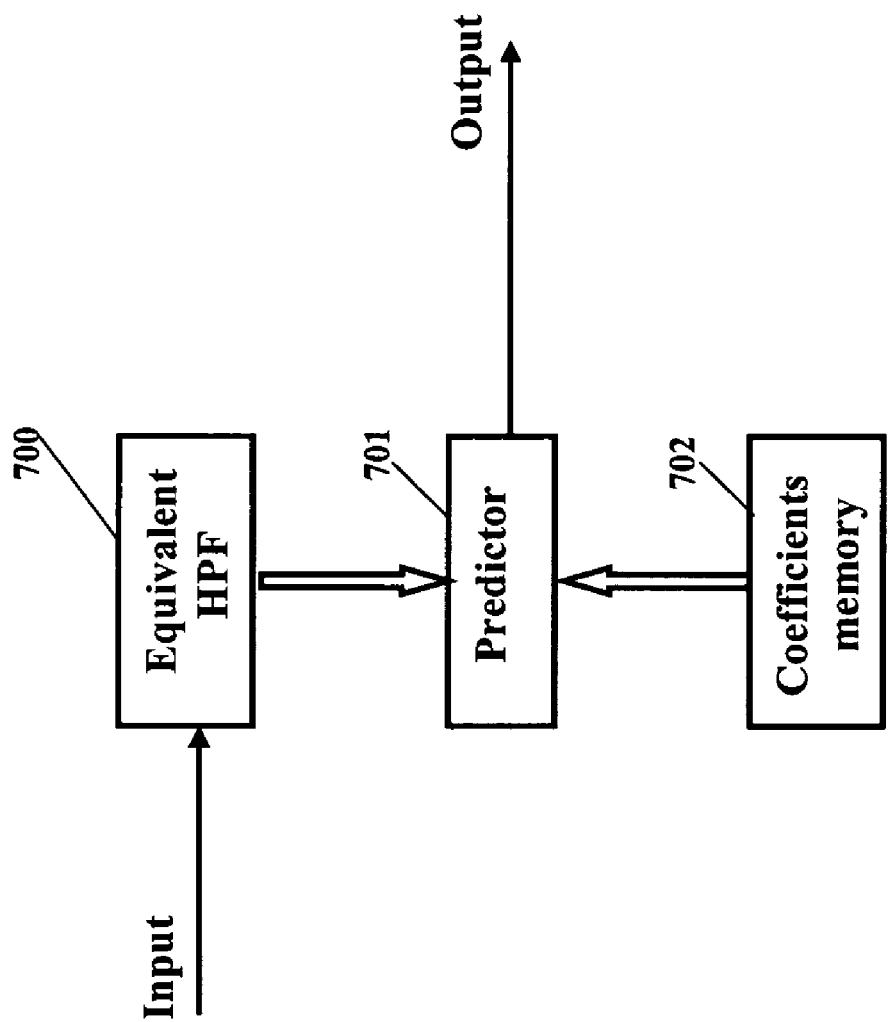
FIG. 7 is a block diagram of a padding high pass filter (HPF) according to the present invention.

A block diagram of a padding HPF that implements equation (2), is shown in FIG. 7. In this block diagram the padding HPF comprises an equivalent HPF 700, a coefficients memory 702 and a predictor 701. The input of the padding HPF receives bits from Viterbi decoder output, these bits being delayed relative to the input of the Viterbi decoder for m sample intervals. As a result, they form a sequence In[i–m]. Equivalent HPF 700 is constructed as a standard filter. This filter carries out calculations according the equation (1) and, at each sample interval, creates at its output the next sample of equivalent HPF response to the sequence of Viterbi decoder output bits:

$$\text{Out}[i-m] = \sum_{j=0}^{n} b[j] * \text{In}[i-m-j] + \sum_{j=1}^{n} a[j] * \text{Out}[i-m-j]. \quad (3)$$

At each sample interval the samples In[i-m], In[i-m-1], . . . , In[i-m-n-1] and Out[i-m-1], Out[i-m-2], . . . , Out[i-m-n-1] are transferred from the equivalent HPF 700 to the first input of the predictor 701. The second input of the predictor 701 is connected to the output of coefficients memory 702, where coefficients A[] and B[] are kept. The predictor 701 combines received samples and coefficients according to the equation (2) and creates at its output the sample Out[i] that is a prediction of the sample that would appear at the end of the response of equivalent HPF to the signal shown in FIG. 5b.

Figure 8:
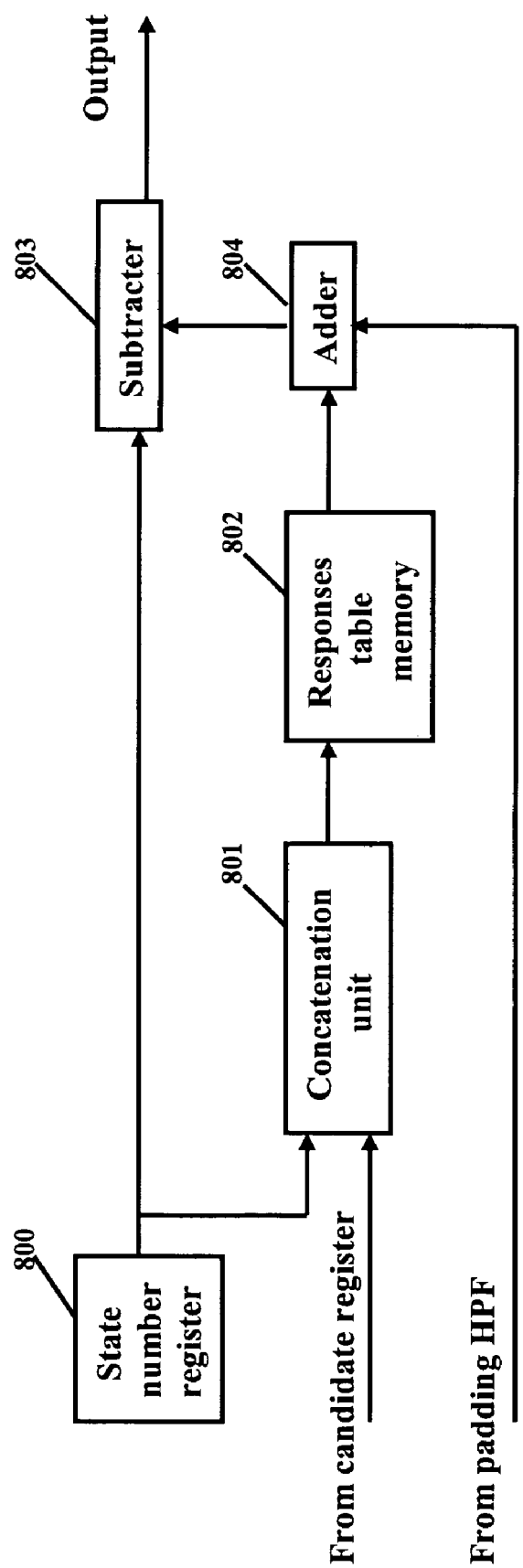
FIG. 8 is a block diagram of a DC calculator according to the present invention.

A block diagram of a DC calculator according to the present invention is shown in FIG. 8. In this diagram the DC calculator includes a state number register 800, a concatenation unit 801, a responses table memory 802, an adder 804 and a subtracter 802. The state number register 800 stores the number of the state that is associated with this DC calculator. A candidate that comes to the first input of the DC calculator in a parallel code, is united in the concatenation unit 801 with the state number, received from the state number register 800. In that way a combination of m bits is formed, m being equal to signal delay in Viterbi decoder in bits. To avoid the calculations of the equivalent HPF response to an arbitrary combination of m bits (an operation that requires m sample intervals), a responses table memory 802 is used. The last sample of the equivalent HPF response to every possible m bits combination is kept in memory 802 at an address that equals the combination. The combination of m bits that was formed in concatenation unit 801, is transferred to the address bus of the responses table memory 802. At the output of the responses table memory 802, the last sample of the equivalent HPF response to this combination is created (it is the last sample of the equivalent HPF response to the signal, shown in FIG. 5c). The output of the responses table memory 802 is connected to the first input of the adder 804. The second input of this adder serves as the second input of DC calculator. The last sample of the equivalent HPF response to the signal that is shown in FIG. 5b comes from the padding HPF to the second input of DC calculator. By adding samples from its two inputs the adder 804 creates at the output the last sample of equivalent HPF response to the signal, shown in FIG. 5a. This sample is subtracted from the last bit of state number in subtracter 802, producing restored DC component last sample for a given specific state to be put at the DC calculator output.

Figure 9:
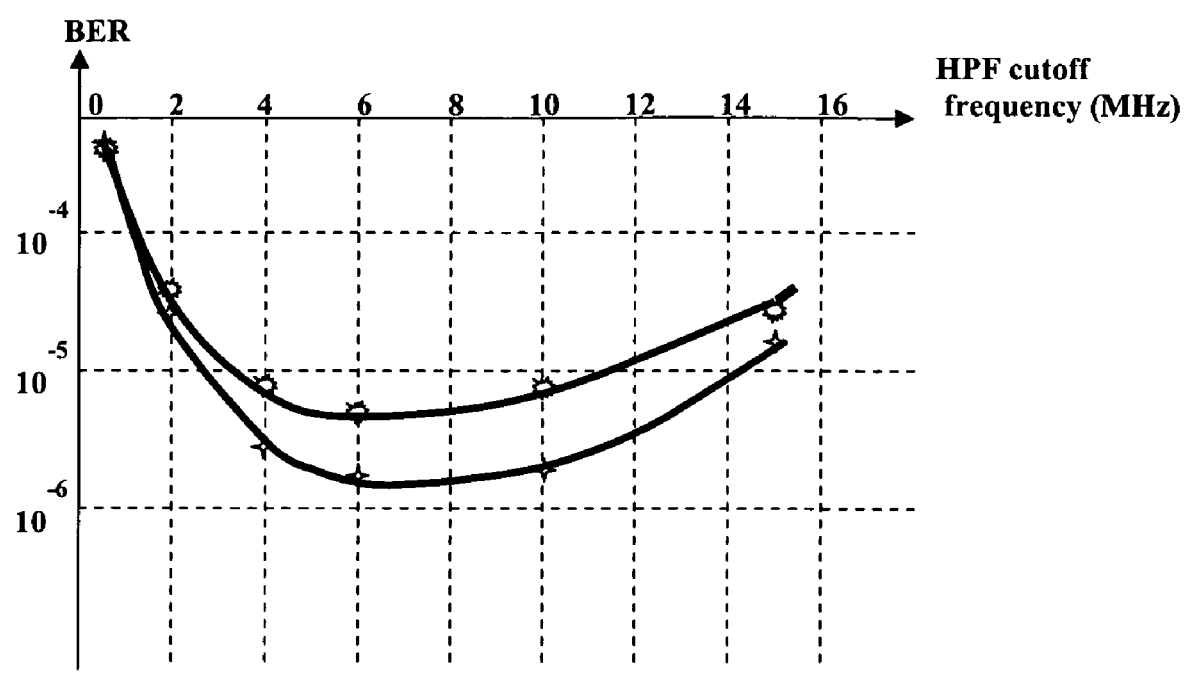
FIG. 9 shows results of comparative tests of read-back signal processing with DC component restoration according to the prior art and according to the present invention.

Comparative tests were carried out for the prior art method of restoring DC and for the method and apparatus of the present invention. The goal of the tests was an estimation of the difference in achievable bit error rates. A pseudorandom pattern was written to the disk with a bits rate 500 Mbits/s using perpendicular recording, and then read back by a magnetoresistive (MR) head. The read-back signal was passed through an analog low pass filter with cutoff frequency 200 MHz, and then through an analog to digital converter with a sampling rate 1.25 GHz. The resultant sequence of samples was processed in a PRML receiver. The detected digital signal was compared with the pattern, initially written to the disk, and bits error rate was calculated. This procedure was repeated with a prior art PRML receiver, and a receiver that contained a Viterbi decoder with DC restoration according to the present invention. The tests were carried out for several different cutoff frequencies of high pass filter that was included into each of the receivers to suppress low frequency noise from adjacent tracks. The obtained results are shown in FIG. 9. As may be seen from the depicted curves, both methods achieve the same results for small cutoff frequencies of high pass filter, when the interference from adjacent tracks is big. When the cutoff frequency is higher than 5 MHz, bits error rate achieved with DC component restoration according to the present invention is 3 . . . 5 times lower, a significant improvement.

A number of implementations of the present invention have been described. Nevertheless, it will be understood that various modifications may be made. Accordingly, other implementations are within the scope of the following claims.

What is claimed is:

1. A decoder for detecting data within an input signal with attenuated low frequency components comprising:
    (a) An N-state Viterbi decoder for processing 2N partial input signals to determine N strings of bits, each of which provides the best approximation to the partial input signal of the associated state, said Viterbi decoder having 2N inputs and N terminations that provide access to the said N strings of bits, wherein one of the terminations is used as a decoder output;
    (b) A correction unit for correcting the DC components of the Viterbi decoder partial input signals, said correction unit having a read-back signal input that is used as a detector input, a bus port and N outputs that are connected to 2N inputs of the Viterbi decoder;
    (c) A feedback bus for transferring said N strings of bits, said feedback bus having N inputs that are connected to the N terminations of the Viterbi decoder and an output that is coupled with the bus port of the correction unit.

2. The decoder of claim 1, wherein the output of the correction unit with the number j, 0<=j<N, is connected to the partial inputs of the Viterbi decoder with the numbers 2j and 2j+1.

3. The decoder of claim 2, wherein the DC calculator comprises:
(a) A state number register for storing the state number;
(b) A concatenation unit for combining two parts of bits sequence into one sequence, having the first input that is configured to receive the state number from the state number register, the second input that is used as the primary input of the DC calculator, and an output;
(c) A responses table memory for generating response samples, said responses table memory having an address input that is connected to the output of the concatenation unit and an output;
(d) An adder for producing the sum of two input samples, said adder having the first input that is connected to the output of the responses table memory, the second input that is used as the secondary input of the DC calculator and an output;
(e) A subtracter for generating the difference of two input samples, said subtracter having the first input that is configured to receive the state number, the second input that is connected to the output of the adding circuit and an output that is used as the output of the DC calculator.

4. A PRML receiver of claim 3, wherein the high pass filter is configured to mask the suppression of the low frequency components in processed signal that occurs during the write and read operations before the said processed signal comes to the input of the said high pass filter.

5. The decoder of claim 1, wherein the correction unit is configured to:
receive the strings of bits from the terminations of the Viterbi decoder as well as the decoded bits from the decoder output;
concatenate each of the said strings of bits with the corresponding state and the hypothetical next decoded bit into one binary combination;
calculate the DC component of the sequence of the decoded bits together with the concatenated combination for each of the state of the Viterbi decoder;
add the calculated DC component to the input signal of the decoder and put it on the corresponding output of the correction unit.

6. The decoder of claim 5, wherein said padding high pass filter is configured to:
receive the decoded bits from the decoder output;
pad the received sequence of the decoded bits with zeros, the number of zeros being equal to the delay of the Viterbi decoder in bits;
calculate the DC component of the padded sequence and put the calculated value at the output of the padding high pass filter.

7. The decoder of claim 5, wherein each of said N DC calculators is configured to:
receive the said string of bits from the associated termination of the Viterbi decoder at its primary input and the said common part of the DC component at its secondary input;
concatenate the received string of bits from the associated termination of the Viterbi decoder with the corresponding state and the hypothetical next decoded bit into one binary combination;
calculate the DC component of the concatenated combination;
add the calculated DC component of the concatenated combination to the said common part of the DC component that has been received at its secondary input and put the sum at its output.

8. The decoder of claim 7, wherein said equivalent high pass filter is configured to have the same transfer function as a cascade connection of a high pass filter that simulates suppression of the low frequency components in the read-write channel with a high pass filter that is used in the PRML receiver.

9. The decoder of claim 7, wherein said equivalent high pass filter is configured to translate to the output its input samples In[i−m−j], 0<=j<=n, as well as bring out the last n output samples Out[i−m−j], 0<=j<=n, i being the number of the current sampling interval, m being the delay of the Viterbi decoder and n being the order of the equivalent high pass filter.

10. The decoder of claim 7, wherein said predictor is configured to:
receive at each sampling interval at its first input the set of said samples In[i−m−j], Out[i−m−j], 0<=j<=n;
receive at its second input the set of coefficients A[j], B[j], 0<=j<=n, that are stored in the said coefficients memory;
calculate at each sampling interval its current output sample Out according to the rule:

$$\text{Out} = \sum_{j=0}^{n} B[j] * \text{In}[i-m-j] + \sum_{j=0}^{n} A[j] * \text{Out}[i-m-j].$$

11. The decoder of claim 5, wherein the padding high pass filter comprises:
(a) An equivalent high pass filter for simulating the suppression of the low frequency components of the read-back signal before the input of the decoder, said equivalent high pass filter having an input that is used as the input of the padding high pass filter and an output;
(b) A coefficients memory for storing a set of coefficient parameters, said coefficients memory having an output through which the said parameters may be read;
(c) A predictor for generating the said common part of the DC component, said predictor having a first input that is connected to the output of the equivalent high pass filter, a second input that is connected to the output of the coefficients memory, and an output that is used as the output of the padding high pass filter.

12. The decoder of claim 1, wherein the correction unit comprises:
(a) A padding high pass filter for determining the part of the DC component that is common to all the states of the Viterbi decoder, said padding high pass filter having an input that is configured to receive the output bits of the detector and an output;
(b) A set of N DC calculators for generating N partial correction signals, each of said DC calculators having a primary input, a secondary input that is connected to the output of the padding high pass filter and an output, with the assembly of the primary inputs of all DC calculators forming the bus port of the correction unit;
(c) A set of N adding circuits for adding said N partial correction signals to the input signal, each of said adding circuits having a primary input that is connected to the output of the associated DC calculator, a secondary input that is joint with the read-back signal input of the correction unit and an output, where a sum of the two input signals is produced and that is used as one of N outputs of the correction unit.

13. A PRML receiver for reproduction of the user data in a storage device based on perpendicular magnetic recording, said PRML receiver comprising:
- (a) connected in cascade read preamplifiers, a low pass filter, an analog to digital converter, a high pass filter, an equalizer and a clock recovery, wherein the input of the read preamplifiers is used as the input of the PRML receiver;
- (b) decoder for detecting data within an input signal with attenuated low frequency components, said decoder having an input terminal and an output, wherein the input terminal of the decoder is connected to the output of the clock recovery and the output of the decoder is used as the output of the PRML receiver.

* * * * *